United States Patent
John et al.

(10) Patent No.: US 11,669,666 B1
(45) Date of Patent: Jun. 6, 2023

(54) METHODS RELATING TO CIRCUIT VERIFICATION

(71) Applicant: Dialog Semiconductor (UK) Limited, London (GB)

(72) Inventors: Dantes John, Munich (DE); Stefano Rachiele, Furstenfeldbruk (DE)

(73) Assignee: Dialog Semiconductor (UK) Limited, London (GB)

( * ) Notice: Subject to any disclaimer, the term of this patent is extended or adjusted under 35 U.S.C. 154(b) by 46 days.

(21) Appl. No.: 17/106,965

(22) Filed: Nov. 30, 2020

(51) Int. Cl.
| | |
|---|---|
| *G06F 30/30* | (2020.01) |
| *G06F 30/35* | (2020.01) |
| *G06F 30/3308* | (2020.01) |
| *G06F 30/33* | (2020.01) |
| *G06F 30/323* | (2020.01) |

(52) U.S. Cl.
CPC .............. *G06F 30/35* (2020.01); *G06F 30/33* (2020.01); *G06F 30/3308* (2020.01); *G06F 30/323* (2020.01)

(58) Field of Classification Search
None
See application file for complete search history.

(56) References Cited

U.S. PATENT DOCUMENTS

| | | | | |
|---|---|---|---|---|
| 5,910,958 A | * | 6/1999 | Jay | G01R 31/318392 714/738 |
| 6,487,704 B1 | * | 11/2002 | McNamara | G01R 31/318314 714/E11.167 |
| 7,290,193 B2 | * | 10/2007 | Kadkade | G06F 13/18 714/741 |
| 10,360,310 B2 | * | 7/2019 | Aberg | G06F 30/00 |

OTHER PUBLICATIONS

T.-A. Chu et al., "Class: ACAD System for Automatic Synthesis and Verification of Asynchronous Finite State Machines," 1993 IEEE, pp. 389-398. (Year: 1993).*
System Verilog TestBench, copyright 2015-2020 ChipVerify, found https://www.chipverify.com/systemverilog/systemverilog-simple-testbench.

* cited by examiner

*Primary Examiner* — Leigh M Garbowski
(74) *Attorney, Agent, or Firm* — Saile Ackerman LLC; Stephen B. Ackerman

(57) ABSTRACT

A method for determining one or more tests suitable for verifying that a circuit conforms to a specification is presented. The specification has at least one state machine. Example circuits are asynchronous circuits. The method includes analysing the specification to automatically determine the one or more tests for circuit verification.

24 Claims, 7 Drawing Sheets

METHODS RELATING TO CIRCUIT VERIFICATION

TECHNICAL FIELD

The present disclosure relates to tools and methods for determining one or more tests for verifying that a circuit, for example an asynchronous circuit, conforms to a specification. The present disclosure also relates to tools and methods for circuit verification.

BACKGROUND

In circuit design, a specification describes a set of characteristics that the final circuit should have. This specification may be set by a user or a customer and may include information on how a circuit should respond to an input signal, timing criteria (for example how much time the circuit takes to respond to an input), and/or how much power it should normally consume during operation. It is desirable for a circuit to conform to its specification.

Typically, a circuit design engineer will start from the specification to model and simulate the circuit prior to design. Current techniques for modelling and simulating circuits, such as asynchronous digital circuits, prior to design involve using custom handcrafted logic to mimic circuit functionality.

A possible implementation of the circuit will then be designed by the engineer with the aim of meeting the requirements of the specification. This may be referred to as "implementation".

After the circuit has been designed by the engineer, it normally undergoes a verification process, where the circuit is tested to ensure it meets the requirements outlined by the specification. A test bench may be defined as an environment under which the designed circuit is subjected to tests to verify it conforms to the specification. The designed circuit undergoing verification may be referred to as the device under test.

Asynchronous circuits are sensitive to changes at their inputs, and multiple valid output sequences can result from the same valid input sequence. Additionally, the asynchronous circuit must be tested, through verification, against illegal input combinations and sequences. A faulty design of an asynchronous circuit can result in the circuit responding incorrectly to an unexpected input sequence and may result in incorrect outputs. A faulty design may also lead to an incorrect response to a correct input sequence, an unexpected response in the absence of inputs, no response to a correct input sequence, and/or incorrect initial values.

Current techniques for verification of asynchronous circuits include formal verification of a circuit for conformance to a signal transition graph (STG) using tools like MPSAT and functional verification by simulation with the actual environment of operation.

Verification of such asynchronous circuits seeks to prove that the asynchronous circuit is immune to sequences of input stimuli outside of a finite set of legal inputs, and that responses are always within a finite set of legal output sequences.

Proving that the design of the asynchronous circuit is not faulty is extremely challenging, because of the large number of stimulus generators and response checkers that must be manually developed to cover all possible interactions between the design and environment. Additionally, these methods are error-prone and not sufficiently thorough, thereby potentially missing failure conditions of the asynchronous circuit.

SUMMARY

It is desirable to provide an improved means of circuit verification when compared with the prior art. In particular, it is desirable to provide an improved means of asynchronous circuit verification when compared with the prior art.

According to a first aspect of the disclosure there is provided a method for determining one or more tests suitable for verifying that a circuit conforms to a specification, wherein the specification comprises at least one state machine, the method comprising analysing the specification to automatically determine the one or more tests.

Optionally, the, or each, state machine comprises a plurality of states, and each state represents a state of the circuit.

Optionally, the plurality of states comprises a first state and a second state, and the, or each, state machine comprises a transition process between the first state and the second state, the transition process representing a process under which the circuit transitions from the first state to the second state.

Optionally, the, or each, state machine comprises a non-transitioning process, the non-transitioning process representing a process under which the circuit remains in the first state.

Optionally, the transition process comprises at least one event and at least one action, and the, or each, action is triggered by at least one associated event.

Optionally, the, or each, action triggers at least one event.

Optionally, the, or each, event represents a stimulus received by the circuit. and the, or each, action represents a response of the circuit to the stimulus of the associated event.

Optionally, the stimulus represented by the, or each, event is at least one of a change in an input to the circuit, a change to an internal signal in the circuit, a change to an output of the circuit, and a change in a timer associated with the circuit.

Optionally, the response represented by the, or each, action is at least one of a change in an output of the circuit, a change in a timer associated with the circuit, and a change in an internal signal within the circuit.

Optionally, the, or at least one of the, actions corresponds to the circuit entering the second state.

Optionally, the, or the at least one of the, actions corresponding to the circuit entering second state is analysed to determine the one or more tests.

Optionally, the at least one state machine comprises a first state machine and a second state machine, and the transition process from the first state to the second state of the first state machine is dependent on a state of the second state machine.

Optionally, the method comprises generating a simulation model using the specification.

Optionally, the method comprises simulating the simulation model, and updating the specification based on simulating the simulation model and prior to analysing the specification.

Optionally, the method comprises generating a test bench for circuit verification using the specification.

Optionally, the method comprises automatically synthesising the circuit from the specification.

Optionally, the circuit is an asynchronous circuit.

Optionally, the one or more tests are automatically determined using a compiler.

According to a second aspect of the disclosure there is provided a method of verifying that a circuit conforms to a specification, wherein the specification comprises at least one state machine, the method comprising analysing the specification to automatically determine one or more tests suitable for verifying that the circuit conforms to the specification, and subjecting the circuit to the one or more tests to verify that the circuit conforms to the specification.

Optionally, the circuit is an asynchronous circuit.

It will be appreciated that the method of the second aspect may include providing and/or using features set out in the first aspect and can incorporate other features as described herein.

According to a third aspect of the disclosure there is provided a computer system comprising a module configured as a test determination tool for determining one or more tests suitable for verifying that a circuit conforms to a specification, wherein the specification comprises at least one state machine, the test determination tool being configured to analyse the specification to automatically determine the one or more tests.

Optionally, the circuit is an asynchronous circuit.

It will be appreciated that the computer system of the third aspect may include providing and/or using features set out in the first aspect and can incorporate other features as described herein.

According to a fourth aspect of the disclosure there is provided a computer system comprising a module configured as a circuit verification tool for verifying that a circuit conforms to a specification, wherein the specification comprises at least one state machine, the circuit verification tool being configured to analyse the specification to automatically determine one or more tests suitable for verifying that the circuit conforms to the specification, and subject the circuit to the one or more tests to verify that the circuit conforms to the specification.

Optionally, the circuit is an asynchronous circuit.

It will be appreciated that the computer system of the fourth aspect may include providing and/or using features set out in the first aspect and can incorporate other features as described herein.

According to a fifth aspect of the disclosure there is provided a circuit having been verified that it conforms to a specification, wherein the specification comprises at least one state machine, using a method comprising analysing the specification to automatically determine one or more tests suitable for verifying that the circuit conforms to the specification, and subjecting the circuit to the one or more tests to verify that the circuit conforms to the specification.

Optionally, the circuit is an asynchronous circuit.

It will be appreciated that the circuit of the fifth aspect may include providing and/or using features set out in the first aspect and can incorporate other features as described herein.

According to a sixth aspect of the disclosure there is provided a method comprising providing a specification of a circuit, wherein the specification comprises at least one state machine, the method comprising generating a simulation model using the specification.

It will be appreciated that the method of the sixth aspect may include providing and/or using features set out in any of the other aspects and can incorporate other features as described herein.

According to a seventh aspect of the disclosure there is provided a method comprising providing a specification of a circuit, wherein the specification comprises at least one state machine, the method comprising generating a test bench for circuit verification using the specification.

It will be appreciated that the method of the seventh aspect may include providing and/or using features set out in any of the other aspects and can incorporate other features as described herein.

According to an eighth aspect of the disclosure there is provided a method comprising providing a specification of a circuit, wherein the specification comprises at least one state machine, the method comprising automatically synthesising the circuit from the specification.

It will be appreciated that the method of the eighth aspect may include providing and/or using features set out in any of the other aspects and can incorporate other features as described herein.

According to a ninth aspect of the disclosure there is provided a method comprising providing a specification of a circuit, wherein the specification comprises at least one state machine, the method comprising generating waveforms, state machine diagrams, and/or documentation from the specification.

It will be appreciated that the method of the ninth aspect may include providing and/or using features set out in any of the other aspects and can incorporate other features as described herein.

BRIEF DESCRIPTION OF THE DRAWINGS

The disclosure is described in further detail below by way of example and with reference to the accompanying drawings in which.

DESCRIPTION

The present disclosure relates to the use of at least one state machine to model the behaviour of a circuit as a means of determining at least one test for verification of a circuit design. State machines are abstract models that may be used to model a system.

It will be appreciated that a state machine may be referred to as "a finite state machine" to indicate that there are a finite number of states or "an asynchronous finite state machine" which implies that inputs can change at any time and not in fixed intervals of a known duration.

Figure 1A:
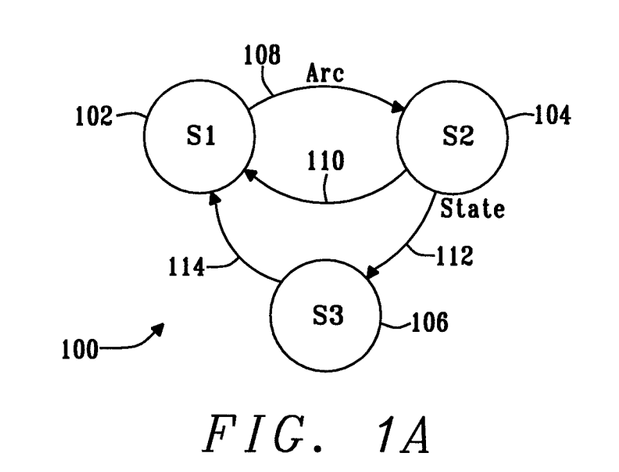
FIG. 1A is a schematic of a state machine.

FIG. 1A is a schematic of a state machine 100 comprising a state 102, a state 104 and a state 106. The states 102, 104 and 106 are also labelled S1, S2 and S3, respectively. Each of the states 102, 104, 106 is coupled to another state by an arc (labelled 108, 110, 112, 114). An arc is used to denote a transition process under which a state machine transitions from one of the states to another state. A state is a known well-defined condition of operation of a system and in the present disclosure, "the system" is the circuit, for example an asynchronous circuit, being modelled by the one or more state machines.

Figure 1B:
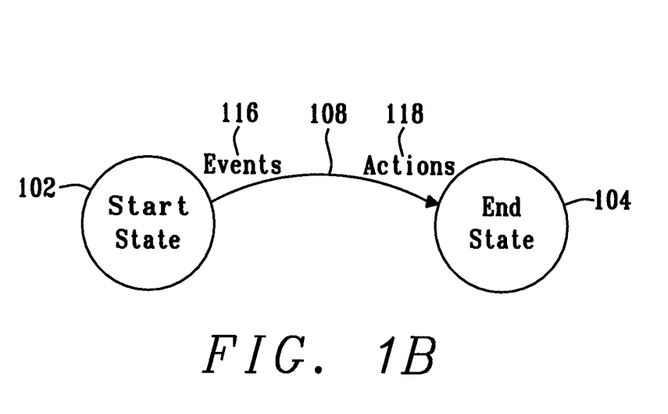
FIG. 1B is a schematic illustrating a specific transition from the "start state" to the "end state"

FIG. 1B is a schematic illustrating a specific transition from the state 102 (labelled the "start state") to the state 104 (labelled the "end state"). The states 102, 104 are coupled via the arc 108 which represents a transition process comprising an event 116 and an action 118.

The language that may be used with a compiler may be described as follows. The role of the compiler is discussed later.

An example of this in terms of actual code is as follows:
```
START_STATE (a1+) {
  e2+=>END_STATE;
}
END_STATE (a2+) {
  // Other transitions
}
```
Event e2+ causes the transitions from START_STATE to END_STATE where Action a2+ happens. a1+ is not relevant to this transition, and is only relevant to the previous transition to START_STATE. This is one of several such transitions.

It will be appreciated that this is only one such implementation and it is possible to use a different syntax or even a GUI to represent the same thing.

An event (such as the event 116) is a change in a condition of an input to the system, a change within the system (including internal signals and outputs), and/or a change in a timer associated with the system. An event corresponds to a stimulus to the system. e2+, as discussed above, can describe a signal e2 transitioning to high.

An action (such as the action 118) may be a change in a condition of an output of the system and/or a change in a timer associated with the system. An action can trigger additional events in the system. An action corresponds to the response of the system. It will be appreciated that an action may also be an internal change within the system. Internal changes may occur, for example, when the system moves to a new state. An internal change may be a change in an internal signal. a2+, as discussed above, can describe a signal a2 transitioning to high.

FIG. 1B shows the system in the state 102. The system is then subject to the event 116 which triggers an action 118. After the action 118 has completed, the system enters the state 104. There is a similarity between an arc and the concept of assertions. An event-action pair is like an antecedent-consequent pair in an implication construct.

It will be appreciated that in asynchronous circuits, the presence of an antecedent does not guarantee that the consequent will always happen, for example if one antecedent occurs which overrides another one and causes a different consequent.

It will be appreciated that although the present example is shown for a single event and a single action, further examples may include multiple sequential and/or parallel events with multiple sequential and/or parallel actions.

For example, consider two states (a start state and an end state) linked via an arc. While in the start state, a sequence of events may be presented to the system which initiates a sequence of actions, that may or may not trigger further events in the system. At the end of a defined set of event and/or action sequences, the system will reach a state that we can consider the end state. The start state and the end state can be distinct or may be the same state.

Figure 1C:
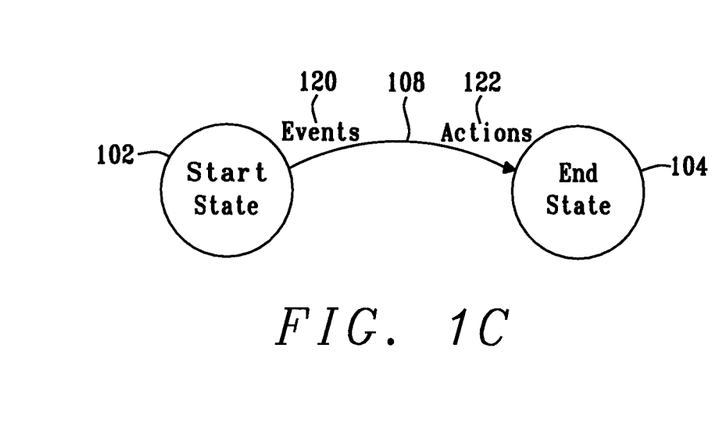
FIG. 1C is a schematic illustrating an alternative example of a transition from the "start state" to the "end state"

FIG. 1C is a schematic illustrating an alternative example of a transition from the state 102 (labelled the "start state") to the state 104 (labelled the "end state"). The states 102, 104 are coupled via the arc 108 which, in this example, represents a transition process comprising a sequence of events 120 and a sequence of actions 122.

If while in the "Start state" (the state 102), the system is subjected to a sequence of events 120 (labelled "Events"), a sequence of actions 122 (labelled "Actions") should be observed after the events are issued. After the action sequence 122 is observed, we can consider the system to be in the "End state" (the state 104). There may be other parallel arcs between these states as well as to or from other states in the system.

The transition process may be referred to as an event/action sequence. The event/action sequence is a generalized sequence of events and/or actions that may include both sequential and concurrent events and/or actions in any combination in accordance with the understanding of the skilled person. In one common use case scenario, they can be represented as a directed graph of events and/or actions without loops, where each parallel branch of operations (an event or an action) may occur concurrently and each one of those branches includes operations that occur sequentially. Any branch may split or join with any other branch.

Figure 1D:
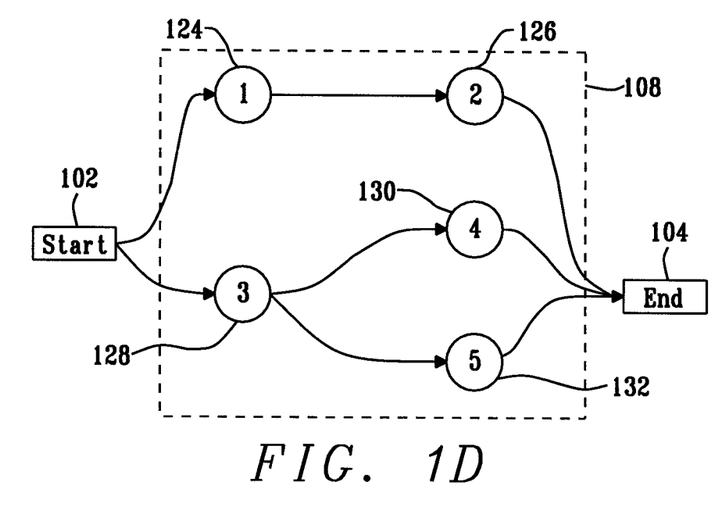
FIG. 1D is a schematic illustrating an alternative example of a transition from the "Start" to the "End"

FIG. 1D is a schematic illustrating an alternative example of a transition from the state 102 (labelled "Start") to the state 104 (labelled "End"). The states 102, 104 are coupled via the arc 108 which, in this example, represents a transition process comprising nodes 124, 126, 128, 130, 132. Nodes 124, 128 represent events and nodes 126, 130, 132 represent actions. The ordering of the actions and events can be traced by moving from the current node to any of the nodes at the end of all the parallel diverging paths from the said node. A succeeding node can be visited only after visiting all preceding nodes.

In this example, both nodes 124, 128 are possible in any order. If node 128 happens first, then any of node 124, 130, or 132 are possible next state actions or events. If instead of node 128, node 124 came first, the only possibilities are then node 126 or node 128. This behaviour is like the behaviour of Petri nets or signal transition graphs (STGs). Specifically, STGs used in asynchronous circuit design have some structural similarities to finite state machines, notably that they can both be expressed as directed graphs.

FIG. 1D may can be represented as follows:

{(a+, b+), (c+, {d+, e+})}, with { } representing parallel paths and ( ) representing serial operations. a . . . e, correspond to 1 . . . 5 in the diagram. It will be appreciated that there are other ways to represent FIG. 1D in accordance with the understanding of the skilled person.

Such syntax can be used instead of a2+ or e2+, as discussed above, when operations are complex. It will be appreciated that due to convention we usually place events before=>, and actions in brackets, as above, however there is no such absolute requirement and alternatives such as the present example may be used, in accordance with the understanding of the skilled person.

Figure 2A:
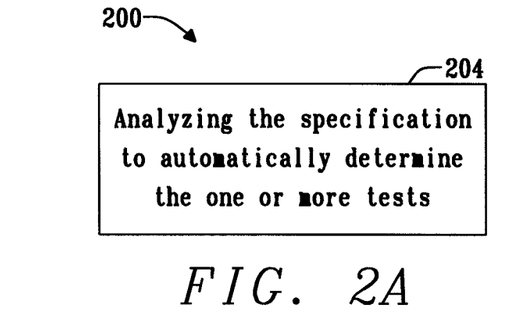
FIG. 2A is a flow chart of a method for determining one or more tests suitable for verifying that a circuit conforms to a specification in accordance with a first embodiment of the present disclosure.

FIG. 2A is a flow chart of a method 200 for determining one or more tests suitable for verifying that a circuit 201 conforms to a specification 203 in accordance with a first embodiment of the present disclosure. The method 200 comprises a step 204, comprising analysing the specification 203 to automatically determine the one or more tests. The specification 203 comprises at least one state machine 206. The, or each, state machine 206 may be, for example, of the type as described in FIGS. 1A, 1B, 1C and 1D. The specification 203 describes the desired behaviour of the circuit 201. In a preferred embodiment, the one or more tests may be automatically determined using a compiler.

In further embodiments there is provided a method for interrogating a specification comprising at least one state machine, where the specification is automatically interrogated to extract/derive/generate other useful properties of the circuit as an alternative to, or in addition to, automatically determining the one or more tests for verification. For example, the method may comprise generating a simulation model using the specification, generating a test bench for circuit verification using the specification, automatically synthesising the circuit from the specification or generating waveforms, state machine diagrams, or documentation from the specification. It will be appreciated that each of the above processes relating to automatic interrogation of the specification, may be carried out in addition to and in combination with each of the other processes relating to automatic interrogation of the specification.

The specification 203 may be prepared by a user. The specification 203 may be a text-based description of the intended behaviour of the circuit 201 in a formally defined language.

The specification 203 may be in the form of a text/binary file or may be provided via a graphical user interface that can capture the specification 203 through user input.

The specification 203 comprising one or more state machines allows complex interactions of the circuit 201 with the external environment to be broken down into simple interactions that can be captured in an unambiguous manner while not requiring addition of implementation specific details. The states serve both to define outputs, as well as to break up complex sequences of transitions. The specification 203 can be used to generate waveforms, state machine diagrams, and/or documentation. The waveforms, state machine diagrams, and/or documentation may be generated from the specification 203 by automatic conversion using a compiler.

The compiler is a software program that can accept a "source file" which describes the specification using formally defined syntax. The compiler includes a "parser" which converts this format into an "intermediate representation" which is usually a complex data structure (data structure is a well understood term, and will be clear to the skilled person).

In this implementation, the complex data structure is a directed graph. The nodes and edges of the said graph can be modelled using well-understood concepts like "objects" in object-oriented languages. Once such a graph is obtained, various algorithms are used to extract the information we want from the graph. An example algorithm is described below.

Once the resulting information is extracted, it can be used to automatically generate code corresponding to checkers. Code generation will be well-understood by the skilled person and is not discussed further, as it simply may involve printing, formatting, and exporting text.

Note that other alternate implementation are possible, chiefly interpretation. In an interpreter, code generation is generally not done explicitly. Instead the "intermediate representation" is directly used to dynamically generate stimulus generators and checkers.

An example of an algorithm that may be used to extract information from the graph is as follows.

In the present example, we have State0, eventA etc.
Consider the following code:
State0{
a+=>StateA;
b+=>StateB;
}
StateA (actA+){
}
StateB (actB+){
}

The compiler translates the code into a data structure which is an instance of a class called FSM. This is composed on instances of STATES, namely 3 instances. Each state instance has references to instances of ARC which describe the events and actions. There will be two arcs in the above example. This is a fairly well understood data structure called a directed graph, where the nodes are STATES and the ARCS are edges.

From this data structure any information about the specification can be queried using code that can be implemented by any competent engineer.

It will be appreciated that other algorithms may be used for the same purpose, as will be clear to the skilled person.

As the specification 203 is implementation independent, it will be possible to improve software tools for better verification, without the need to change the specification 203. The specification 203 is implementation independent because it tells us what the circuit does, rather than how to test it. Thus, if newer algorithms are discovered to verify such circuits, we can automatically extract the information required for this from the specification 203. This means we can perform better tests on the same devices with the same specification 203 and an updated compiler.

The specification 203 can formally and unambiguously capture the required and permitted behaviour of the circuit 201 including concurrency.

Software programs can analyse the specification 203 to automatically infer one or tests that can prove the correctness of an implementation of the circuit 201. This enables the testing of any implemented circuit 201 against the specification 203 to verify it conforms to the specification 203. The one or more tests may comprise one or more transactions, each comprising one or more stimuli to be provided to a design of the circuit 201 for verification purposes. The one or more stimuli may cover both legal and illegal input sequences.

The one or more tests may be an exhaustive list of tests required to confirm that the circuit 201 design conforms to the specification. In a further embodiment, the one or more tests may be a non-exhaustive list of tests such that the design of the circuit 201 may not fully conform to the specification.

Figure 2B:
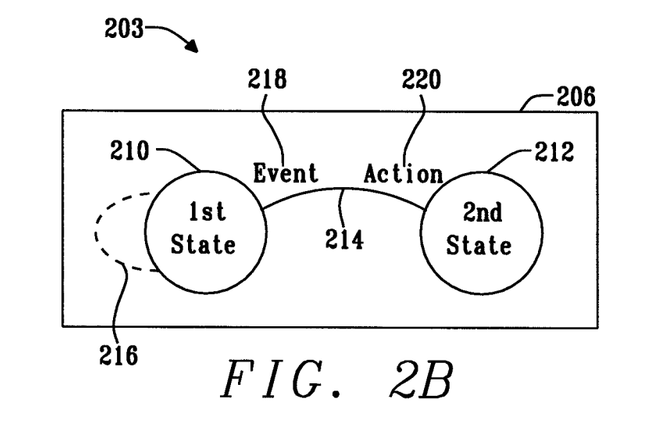
FIG. 2B is a schematic of the specification.

FIG. 2B is a schematic of the specification 203. A single state machine 206 is illustrated in the present example. It will be appreciated that in further embodiments, the specification 203 may comprise more than one state machine 206. The following description relating to FIG. 2B relates to the single state machine 206 and it will be clear to the skilled person how the following description may be applied to a specification having multiple state machines.

Figure 2C:
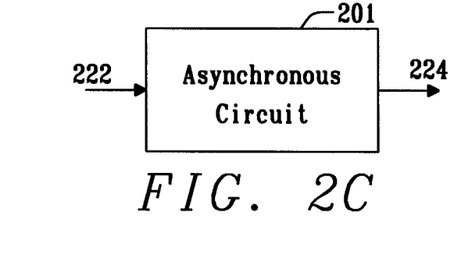
FIG. 2C is a schematic of the circuit that is required to undergo a verification process.

FIG. 2C is a schematic of the circuit 201 that is required to undergo a verification process.

Despite the structural similarities between the state machines of the specification 203 and STGs used in the design of asynchronous circuits, the state machines formally describe the required behaviour of a circuit 201 (i.e. the way the circuit should react to external stimuli), while STGs do not. Specifically, STGs specify the environment in which the circuit can function correctly but does not account for unexpected inputs. The circuit 201 may be an asynchronous circuit. Additionally, the state machine specification 203 includes the ability to distinguish between level sensitive and edge sensitive inputs—STGs cannot be used in this way.

An STG is a notation for describing the exact changes and order of signal transitions at the boundary of the circuit in a timing independent way. Some notable differences between STGs and state machines are that state machines do not force the inputs to be constrained (this is part of the specification; implies immunity to faulty inputs), and can have timing constraints which STGs do not have. Timing constraints are requirements, as per the specification, that it is desirable to meet.

One crucial difference between state machines and STGs is that STGs completely describe the circuit in that there is a one-to-one correspondence between the STG and the circuit. A state machine on the other hand is deliberately non-unique so that there are multiple circuits that can conform to the state machine and vice-versa.

Even though multiple circuits can be built for an STG, all of them behave in exactly the same way in the signal ordering at the boundary. The specification we have here, including state machines, has a flexibility in choosing what is important and what is not. In other words, there may be different circuits with a different set of signal transitions, but there is a clear understanding of what is important and what is not. This is what we mean by "multiple circuits".

This feature of state machines is advantageous for the present disclosure. Specifically state machines offer the ability to represent the key specifications without getting into the exact low-level details of all the signals in the design as in an STG. Use of an STG instead of a state machine for specification development can lead to longer development times and more rigid specification requirements when compared to the opportunities offered by state machines.

The specification 203 enables a separation of the required behaviour from the implementation of the circuit 201 that has been designed and is subject to verification tests.

The approach described herein can give flexibility in the way circuits, such as asynchronous circuits, are designed, while at the same time providing a set of requirements against which such a circuit can be tested for verification purposes.

The use of the specification 203 provides a simplified representation of a specification when compared to Petri nets and STGs which can provide shorter design cycles. STGs are too detailed and need a lot of effort to setup compared to the approach described herein. The methods disclosed herein provide a saving in time and productivity without the requirement to consider less-relevant low level details.

The state machine 206 may comprise a plurality of states, where each of the states represents a state, for example a unique state, of the circuit 201. In the present embodiment, the plurality of states comprises a state 210 and a state 212. It will be appreciated that multiple states may represent the same state of the circuit.

The state machine 206 also comprises a transition process 214 between the state 210 and the state 212. The transition process 214 represents a process under which the circuit transitions from the state 210 to the state 212.

The state machine 206 may also comprise a non-transitioning process 216. The non-transitioning process 216 represents a process under which the circuit remains in the state 210. It will be appreciated that in further embodiments, the state 210 and/or the state 212 may be associated with a non-transitioning process, where the circuit 201 remains in its present state.

The transition process 214 comprises an event 218 and an action 220, where the action 220 is triggered by the event 218. It will be appreciated that in further embodiments, the transition process 216 may comprise more than one event and/or more than one action. Each action may be triggered by at least one associated event.

In a further embodiment each action may trigger at least one event.

In the present embodiment, the event 218 represents a stimulus 222 received by the circuit 201 and the action 220 represents a response 224 of the circuit 201 to the stimulus 222 of the event 218.

In summary, the operation of the circuit 201 may be described as follows. The circuit 201 is in the state 210. The circuit 201 then receives the stimulus 222 which is represented by the event 218, which causes the circuit 201 to transition from the state 210 via the transition process 214. The circuit 201 responds to the stimulus by the response 224, which is represented by the action 220. Once the action 220 has completed the circuit 201 will have transitioned to its state 212 which is distinct from the state 210. The non-transitioning 216 process represents a procedure where the circuit 201 experiences a stimulus 222 and produces a response 224, after which the circuit 201 returns to its starting state (the state 210).

The stimulus 222 represented by the event 218 may be at least one of a change in an input to the circuit 201, a change to an internal signal in the circuit 201, a change to an output of the circuit 201 and a change in a timer associated with the circuit 201.

The event 218 may be a change to a single electrical input or a change to several inputs combined through Boolean operations (as in a combinational circuit). Similarly, the event 218 may be a change to a single output signal or a change to an output that is a Boolean function of several signals (for example inputs, outputs and/or internal signals). The compiler will be able to figure out the individual signal activity if the event 218 is dependent on several signals. The algorithms underpinning the operation of the compiler in this way will be well known by the skilled person. Specifically, any Boolean function can be analysed to find the input variable combinations that can results in a true (or equivalently false) value.

The response represented by the action 220 may be at least one of a change in an output of the circuit 201, a change in a timer associated with the circuit 201, and a change in an internal signal within the circuit 201.

The action 220 may correspond to the circuit 201 entering the state 212 such that the action may be analysed to determine the one or more tests for verification of the circuit 201.

In this example, the action 220 serves as an indication of a successful transition to the "end state" (the state 212). This enables the verification of asynchronous circuits in the presence of non-determinism, which may exist in asynchronous circuits due to metastability.

The specification 203 may be analysed to determine the one or more tests. For example, events and/or actions may be analysed to determine the one or more tests. For example, the event 218 and/or action 220 may be analysed to determine the one or more tests.

Consider a state "State0" having an event "eventA" which gives an action "actionA", and an event "eventB" which gives an action "actionB", where we end up in a state "StateA" after "actionA" and a state "StateB" after "actionB". For all other events (for example "eventC/D/ . . . " nothing is be done. This behaviour will be presented in the specification 200 using one or more state machines, as described previously.

This may be represented by code as follows:
State0 {
eventA=>StateA;
eventB=>StateB;
}
StateA (actionA) {
}
StateB (actionB) {
}

In the current example and based on the specification 200 the following tests can be derived:
1. In State0, Give eventC/D/ . . . randomly and observe that nothing happens.
2. Give eventA also with eventC/D/ . . . and see that only eventA happens. We then move to StateA. We are now not in State0, but we have further tests, so we wait till we arrive back in State0. Other tests where we test StateA in a similar way will ensure this will happen in the future. This assumes that all states are reachable from all other states. This is something that can be proven using known graph theory methods. The events eventC/D/ . . . etc. may be valid inputs in these other states.
3. Once we are back in State0, we need to do several more tests: eventB as above, both eventA and eventB in isolation, both eventA and eventB reasonably close together (with/ without other events). In all, except the last case, we expect only the corresponding action within an acceptable time (with may also be provided by the user as a timing annotation). In the last case, we can expect either actionA or actionB, but not both (either can occur due to non-determinism). Based on the observed action, we move to the specified state and repeat with other states.

All these cases are tried randomly with varying timings. The event list tells us how to constrain the input to verify the design in the best possible way. The actions tell us of how to interpret output sequences, how to determine next state, and to schedule the next set of events.

Additional coverage monitors will inform the user on how well the circuit has been tested after these randomized tests. This process continues until we are satisfied with the coverage reports.

Other stimuli may also be applied to further enhance the tests: e.g. random resets for reboots.

These tests may be carried out concurrently for all the state machines in the specification 200. Preferably, we will want to check that every arc in every state machine in the system is visited at least once The one or more tests may be automatically generated by the compiler. The rules for generating the tests for verifying the design may be contained in the compiler. The rules include (but is not limited to) the rules mentioned earlier (e.g. eventA->actionA, . . . ).

For example, say we want to create a check for the transition a+->StateA. The tool may perform the same steps in an implementation that is almost exactly a direct translation of those steps into code. For example, step (1) in the manual description can be easily automated by seeing that we need to toggle the signals corresponding to eventC/D randomly. The information on which signals correspond to this can be easily extracted from the data structure, as discussed previously. Now this can be used to generate SystemVerilog code that randomly toggles those signals. This forms part of the test. Similar steps can be followed for all the other signal toggles under this.

It can seen that by using the "intermediate representation", one can extract the above information for tests using algorithms that can be implemented by the skilled person. The examples herein use some entry in the intermediate representation either directly or through a simple transformation that the skilled person will understand.

Some further points should be noted:
1. Events, for example all Events, within a state can be analysed to determine the possible signals that are permitted to be toggled in that state. This also puts a bound on when, and the type of transitions that may follow.
2. A coverage monitor can take several forms, including whether all states are visited and whether all possible transitions and paths are visited.

Figure 3:
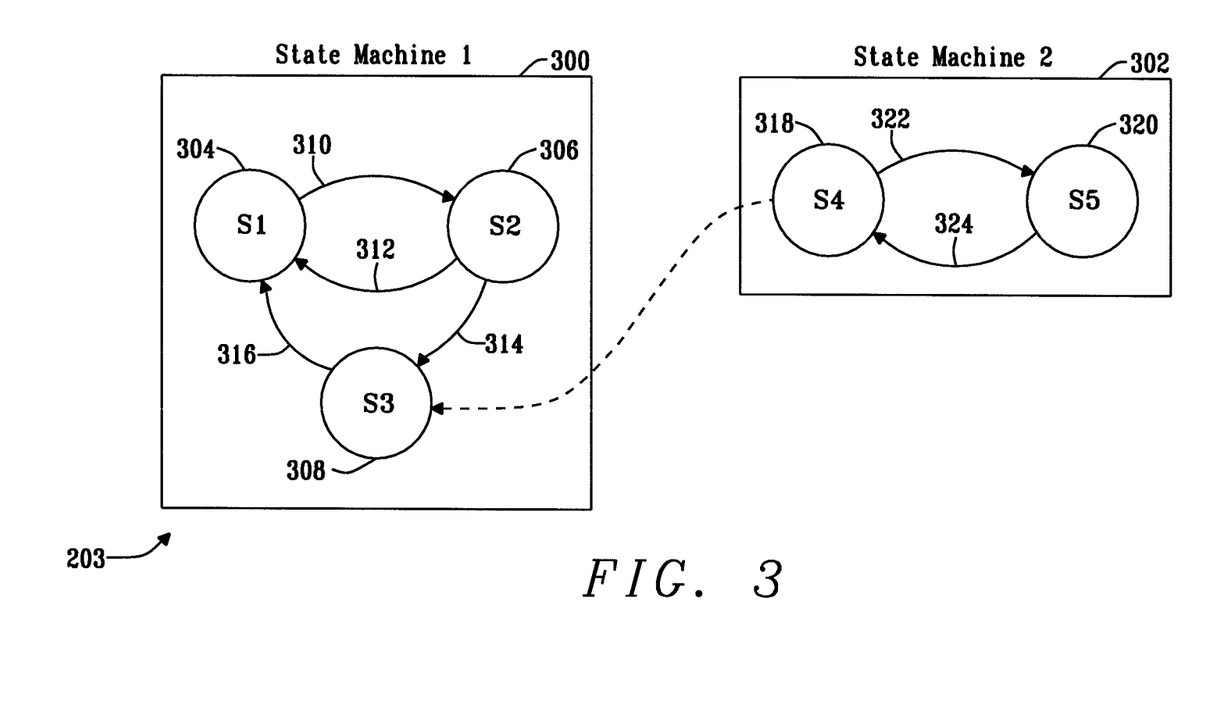
FIG. 3 is a schematic of an alternative embodiment of the specification.

FIG. 3 is a schematic of an alternative embodiment of the specification 203, where the at least one state machine comprises a state machine 300 and a state machine 302.

The state machine 300 comprises states 304, 306, 308 and transition processes 310, 312, 314, 316. The state machine 302 comprises states 318, 320 and transition processes 322, 324.

In the present example, the transition process 314 from the state 306 to the state 308 of the state machine 300 is dependent on the current state of the state machine 302. Specifically, to transition to the state 308 in the state machine 300, it is required that the current state of the state machine 302 is the state 318. If the state machine 302 is in the state 320, then the state machine 300 will not transition from the state 306 to the state 308.

The arrow from 318 to 308 (between the state machines 1 and 2) may be an event, such as the event 218 as previously described.

In code, this event, say evt1+, means that evt1 goes high, where evt1 is a variable declared as
evt1: fsm2 in S4,
where fsm2 is a name/descriptor referring to State machine 2

This implies that there is one other simpler way to think of transition process 314—specifically, it depends on an event which happens to be "State machine 2 is in S4". This may be the only event or may be one of multiple events in the arc 314

The requirement of a state of one state machine (the state machine 300) being dependent on a state of another state machine (the state machine 302) means that these state machines may be referred to as being "interconnected". The use of interconnected state machines in the specification 203 means that concurrency may be considered within the specification 203 of the circuit 201. For example, the transition process 310 to the state 306 is independent of the transition process 322 to the state 320 meaning the transition processes 310, 322 can happen concurrently. The transition process 314 to the state 308 however has a requirement that the state 318 needs to be active, and this is a requirement that should be met by the circuit 201.

It will be appreciated that in a further embodiment, the specification 203 may comprise two or more state machines that are not interconnected, and therefore do not interact with each other.

Figure 4A:
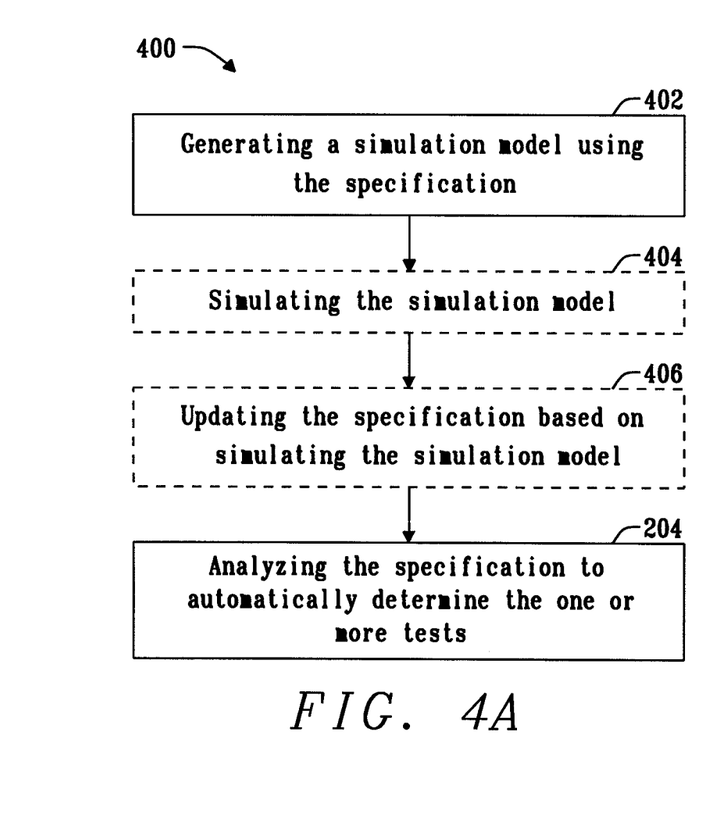
FIG. 4A is a flow chart of a method in accordance with a second embodiment of the present disclosure.

FIG. 4A is a flow chart of a method 400 in accordance with a second embodiment of the present disclosure. The method comprises the step 204 as previously described and relate to the specification 203 as previously described.

The method 400 comprises generating a simulation model using the specification 203 at a step 402. The method 400 may further comprise simulating the simulation model at a step 404 and updating the specification 203 based on simulating the simulation model at a step 406, prior to the step 204.

When we say "simulating the simulation model", it may mean simulating the simulation model as part of a larger circuit where the simulated circuit that is being design will eventually be used.

The simulation model may be generated from the specification 203 by automatic conversion using a compiler. The simulation model can mimic the operation of the circuit 201 based on its specification 203 within a simulation.

The compiler may generate the simulation model using the same intermediate representation as discussed previously. From this we can generate models in any format that have some mechanism to wait for events and then trigger actions.

In summary, the specification 203 may be processed (compiled) by means of a software program to provide the simulation model.

In a further embodiment, the method 400 may comprise generating more than one simulation models from the specification 203. In a further embodiment, the method 400 may comprise generating more than one type of simulation model from the specification 203. Each type of simulation model may be suitable for a different simulator.

The simulation model may be based on the target platform. One common target platform is a model in the SystemVerilog language which allows users to describe concurrently processes in an event-based language. We can describe threads, events, comparisons of signals, etc. A tool can read the input (see example earlier with eventA/B/ . . . ) and generate a file in the SystemVerilog language which can be simulated in an available simulator. This file will behave very similarly as the described specification 203.

With reference to the earlier example, the tool will generate code that will describe the below process:
1. If in State0, Wait for eventA or eventB, ignoring all other events. If eventA arrive, ignore eventB and create actionA at the outputs. For eventB, ignore eventA and create actionB. If both come within a certain window, randomly select one of the actions. Then move to the corresponding state, stateA or stateB
2. Repeat for other states
3. Additionally some more circuit related functionality is added like "resets". A reset input initializes the model to a known state
4. Potentially create warnings if any input violations are observed.
5. Use timing annotations to simulate delays at the outputs to indicate plausible delays in a real circuit.
6. This model is not a real circuit but is only intended to look like one. The real circuit will be designed and is expected to behave very similarly.

The intermediate representation has all the information we need here. So the compiler would simply automatically implement the process as described above. For example, the compiler would generate code that implements a set of state machines which in one case may be an infinite loop with wait statements within a case statement where each entry in the case statement corresponds to a state and with several wait statements corresponding to events like eventA and eventB. Actions like actionA/B are simply standard SystemVerilog variable assignments with time delays. For a schematic, different structures may be used. For example a flip-flop model can be used for event waits, and delay elements for output transitions and timings.

For a different platform (like a schematic based simulator), a different implementation may be created by the compiler, but it will behave the same at the boundary. All models may be auto-generated.

A method to convert the specification 203 to a test bench for use with a verification tool may include a co-simulation involving software that may dynamically load the specification 203 and interact with the design at runtime.

In this example there is no requirement for generation of a physical test bench by directly reading in the specification 203 (interpreting), and dynamically generating checkers in the simulation model. Essentially this works as an interpreter for the specification 203 instead of a compiler.

A further method to convert the specification 203 to a test bench for use with a verification tool may include a formal/static analysis between the specification 203 and the design. This method uses advanced static checkers to compare the specification 203 and the design and perform the verification. This essentially avoids simulation by mathematically running the specification 203 using a formal verification tool.

The simulation model will exhibit the behaviour as described in the specification 203, as the simulation model is generated based on the specification 203. Therefore, the simulation model can be used as a proxy to the design of the circuit 201 for various applications. This allows the specification 203 to be analysed using a simulation tool prior to design of the circuit 201, thereby avoiding redesigns.

The ability to create simulation models provides a key advantage over the prior art, as the intended behaviour of the circuit 201 can be tested at a system level, and prior to the circuit 201 being designed for verification. In effect, the specification 203 is used to generate the simulation model which can be used to verify aspects of the system prior to design and implementation of the circuit 201. This allows the system level fine-tuning to happen much earlier than in the prior art and without waiting for circuit level implementation.

Prior solutions have relied on manually creating coarse implementations of the intended behaviour of the circuit 201 which are time consuming and error prone.

The specification 203 may be used to generate the simulation model in any desirable format using automatic software conversion tools. This allows for simulation before the circuit 201 is implemented for verification.

Timing annotations in the specification 203 may be used to check for performance during verification, to create timing accurate models for external simulation, and for constraints during synthesis of asynchronous circuits.

Timing annotations are statements added to the functional description in the specification 203 that puts upper bounds to the time an action can take. Say we expect actionA to follow eventA, in tA seconds, we can add a language construct within the specification 203 specifying this requirement. This will translate to a simulated delay in the simulation model (for simulating the real delay in the eventual circuit), and will translate to a timing checker in the test bench to ensure that this relationship is indeed preserved in the final design. It may be possible due to non-determinism that actionA does not occur at all after eventA, if there is a competing eventB. However the tool can ensure that eventB then happens in a reasonable time.

Simulation of the simulation model may be used to check that the specification 203 matches the intended behaviour of the circuit 201 and performs as expected. If the simulation indicates that the circuit 201 behaviour is not accurately represented by the specification 203, then the specification 203 can be updated accordingly, prior to using the specification to determine the one or more tests for verification at the step 204.

If the simulation model indicates that the present specification 203 is unsuitable then the following procedure may be undertaken: changing the specification 203, recompiling (to generate an updated simulation model), and rerunning the simulation.

By checking that the specification 203 matches the intended behaviour of the circuit 201 it is possible to ensure that the one or more tests determined at step 204 are suitable for verification of the circuit 201.

In a further embodiment, after updating the specification 203 at the step 406, the process may be repeated in which a further simulation model is generated using the updated specification at the step 402, the further simulation model is simulated at the step 404 and the specification 203 is again updated. This process may be repeated until the simulation demonstrates that the specification 203 matches the intended behaviour of the circuit 201, or until the process has been repeated a predefined number of times.

It will be appreciated that the step 406 may be omitted in a final repetition, for example if the results of the simulation at the step 404 demonstrates that the specification 203 is a sufficiently accurate representation of the circuit 201.

Figure 4B:
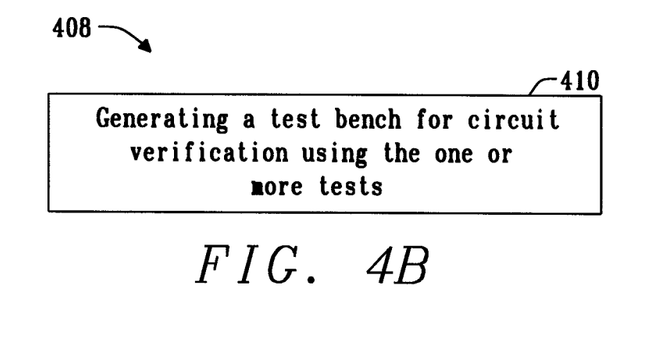
FIG. 4B is a flow chart of a method in accordance with a third embodiment of the present disclosure.

FIG. 4B is a flow chart of a method 408 in accordance with a third embodiment of the present disclosure. It will be appreciated that the method 408 may comprise any of the steps of any of the methods as described herein, in accordance with the understanding of the skilled person.

In the present embodiment, the method 408 comprises generating a test bench for circuit 201 verification using the specification 203, at a step 410. A test bench is a well-known term in the field of circuit design, as will be clear to the skilled person. In the present example, the test bench is a simulation environment under which the designed circuit, also referred to as the "circuit design" or the "device under test" (in this case the circuit 201) or the "implementation" (as discussed previously) is subjected to the one or more tests to verify it conforms to the specification 203. In summary, the test bench can be used in a simulation to verify the circuit 201 being tested. As the simulation model (discussed in relation to FIG. 4A) is generated using the specification 203, it is guaranteed to conform to the test bench.

The test bench may be generated from the specification 203 by automatic conversion using a compiler. The test bench may be generated in parallel to the simulation model.

Since the simulation model and the test bench are both automatically generated from the same specification 203 the following features arise:

1. The simulation model should always pass all the tests in the test bench (the simulation model should conform to the test bench).
2. The final design should always pass the tests also
3. If we assume that the test bench is correct, then the simulation model and the final design should be equivalent in functionality, i.e. there is a conformance between them
4. This implies that if the simulation model is then replaced by the design, there should be no observable difference in functionality.
5. Hence someone using the design, can initially start with a simulation model before the design is available and then replace the simulation model with a design when available and there should be no observable difference.
6. This saves considerable time since the design of the block can be parallelized with other developments instead of the normal serial approach.

The simulation model (or models) may be supplied to circuit designers who will then proceed with implementing other portions of the design while using the simulation model (or models) to fill-in for this design while the design is being developed. The circuit design may be designed in parallel and when complete it may be tested against the test bench mentioned above. If the circuit design passes the one or more tests, the circuit design may then be supplied to the designers to replace the earlier iteration of the design.

Figure 4C:
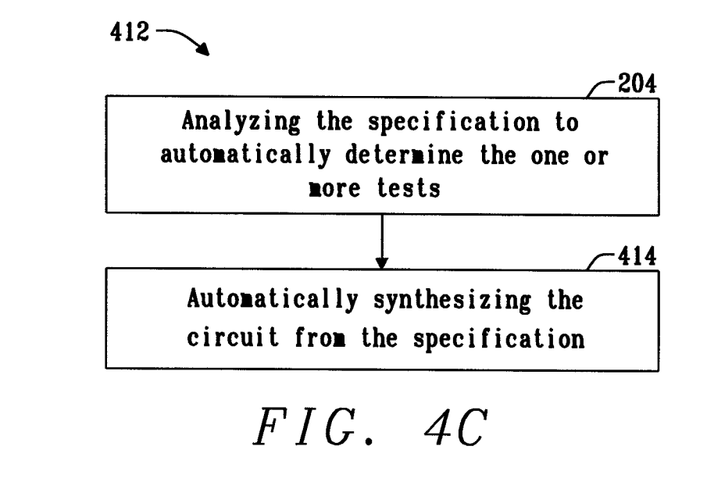
FIG. 4C is a flow chart of a method in accordance with a fourth embodiment of the present disclosure.

FIG. 4C is a flow chart of a method 412 in accordance with a fourth embodiment of the present disclosure. The method comprises the step 204 as previously described and relates to the specification 203 as previously described. It will be appreciated that the method 412 may comprise any of the steps of any of the methods as described herein, in accordance with the understanding of the skilled person.

In the present embodiment, the method 412 comprises automatically synthesising the circuit 201 from the specification at a step 414. The synthesised circuit 201 is the "designed" circuit as previously discussed and therefore may be subjected to the one or more tests to verify the circuit 201 conforms to the specification.

The synthesis step (step 414) may not depend on the test generation step (204). For example, the synthesis step (step 414) may be carried out independently of the test generation step (step 204).

The synthesis step (step 414) may be carried out in parallel to the test generation step (204) and/or the simulation model generation step (step 402).

Figure 5:
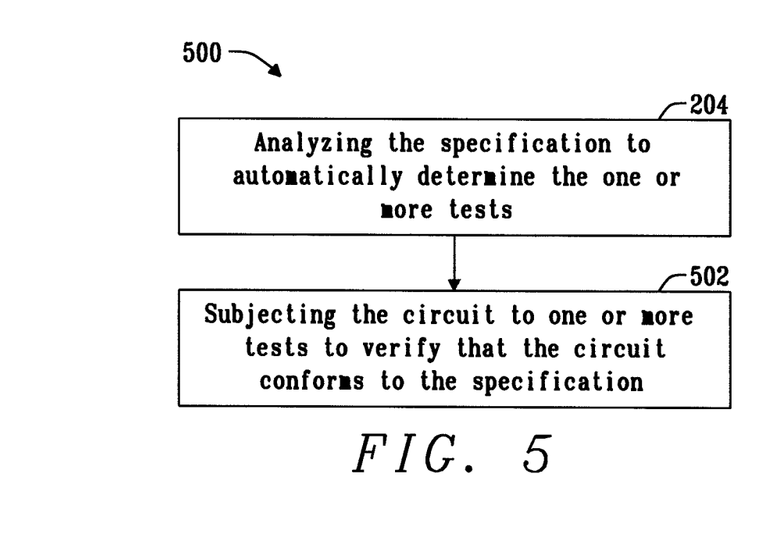
FIG. 5 is a flow chart of a method of verifying that the circuit conforms to the specification in accordance with a fifth embodiment of the present disclosure.

FIG. 5 is a flow chart of a method 500 of verifying that the circuit 201 conforms to the specification in accordance with a fifth embodiment of the present disclosure. The method comprises the step 204 as previously described and relate to the specification 203 as previously described. It will be appreciated that the method 500 may comprise any of the steps of any of the methods as described herein, in accordance with the understanding of the skilled person.

The method 500 further comprises a step 502 of subjecting the circuit 201 to the one or more tests to verify that the circuit 201 conforms to the specification. The verification procedure may be carried out automatically to verify the circuit 201 conforms to its specification. The verification procedure can enable the intended behaviour of the circuit 201 to be verified, even in the presence of multiple valid outputs, and concurrent inputs.

Figure 6A:
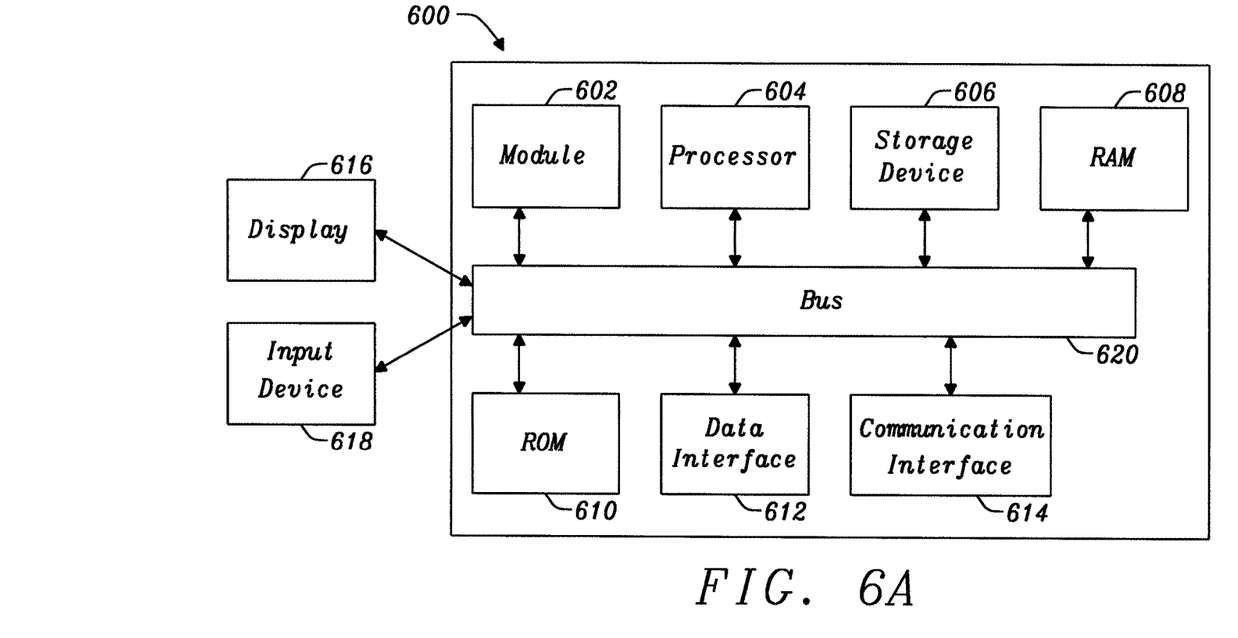
FIG. 6A depicts a computer system which comprises specially modified components for carrying out the methods of the present disclosure, and in accordance with a sixth embodiment of the present disclosure.

FIG. 6A depicts a computer system 600 which comprises specially modified components for carrying out the methods of the present disclosure. The computer system 600 comprises a module 602 which is configured as a test determination tool for determining one or more tests suitable for verifying that a circuit, for example an asynchronous circuit, conforms to a specification, in accordance with a sixth embodiment of the present disclosure. The methods described herein to determine the one or more tests (for example the method 200) may be run using the test determination tool.

The computer system 600 may comprise a processor 604, a storage device 606, RAM 608, ROM 610, a data interface 612, a communications interface 614, a display 616, and an input device 618. The computer system 600 may comprise a bus 620 to enable communication between the different components.

The computer system 600 may be configured to load an application. The instructions provided by the application may be carried out by the processor 604. The application may be the test determination tool.

A user may interact with the computer system 600 using the display 616 and the input device 618 to instruct the computer system 600 to implement the methods of the present disclosure in determining the one or more tests for verification.

In a further embodiment the module 602 may be configured as a circuit verification tool for verifying that a circuit, for example an asynchronous circuit, conforms to a specification. The methods described herein to verify the circuit conforms to a specification may be run using the circuit verification tool.

Figure 6B:
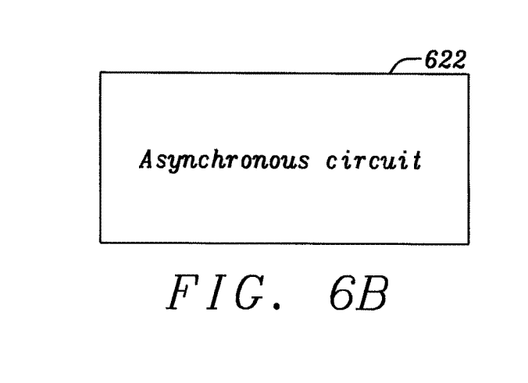
FIG. 6B is a schematic of an circuit having been verified that it conforms to a specification using the methods described herein, and in accordance with a seventh embodiment of the present disclosure.

FIG. 6B is a schematic of a circuit 622 having been verified that it conforms to a specification using the methods described herein, and in accordance with a seventh embodiment of the present disclosure. The circuit 622 may, for example, be an asynchronous circuit.

Figure 7:
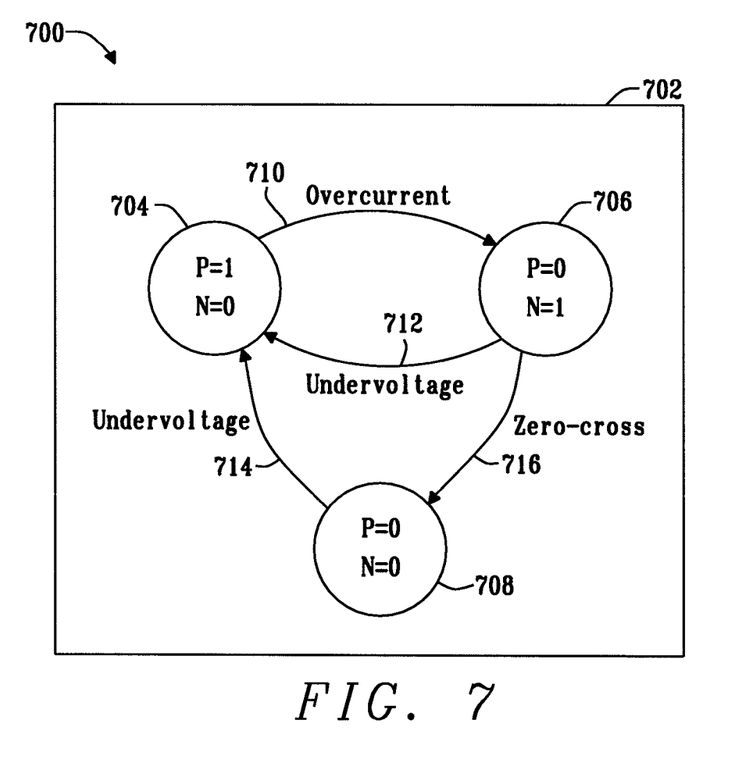
FIG. 7 is a schematic of a specification of a buck converter controller in accordance with an eighth embodiment of the present disclosure.

FIG. 7 is a schematic of a specification 700 of a buck converter controller in accordance with an eighth embodiment of the present disclosure. The present embodiment illustrates how the methods disclosed herein may be applied where the circuit 201 to be designed and verified is the buck converter controller. It will be appreciated that the buck converter controller presented herein is a simple example and the methods disclosed herein can be applied for different and/or more complex circuitry.

With reference to the method 200 of FIG. 2A, the specification 700 corresponds to the specification 203 and the specification 700 comprises at least one state machine.

In the present embodiment, the specification 700 comprises a state machine 702.

The state machine 702 comprises states 704, 706, 708, each corresponding to a state of an output of the buck converter controller. In response to various inputs, the state machine will move to the next state via one of the transition processes 710, 712, 714, 716 and the outputs will take on the new values for P and N. "P" is an input to enable the P-side transistor (the high side transistor) and "N" is an input to enable the N-side transistor (the low side transistor) in a buck convertor controller.

In summary of the approach described previously, in a practical example a user will first conceptualize what the circuit 201 should do. This is usually as waveforms, but can take any suitable form in accordance with the understanding of the skilled person. Then the designer will try to capture this concept in the generation of the specification 203 in a file format. The concepts behind the language used to describe the specification 203 have been described previously (state machines, events, actions, interconnections, etc.). The designer can use the software compiler tool to convert the specification 203 to a simulation model which behaves as described in the file.

In this specific example relating to a buck converter controller, the user will start from a waveform that is indicative of the desired behaviour of the buck converter controller and form the specification 700 based on the waveform. The user will conclude that the PMOS transistor and the NMOS transistor of the buck converter controller is to be turned off (=0) in the beginning (OFF state)—this is the initial state, and may also be referred to as the reset state. When Undervoltage input goes high (transition process 714), the PMOS alone has to be turned on (we can call this PON state, as shown by the state 704). After some time, the Overcurrent signal input will go high (transition process 710) and then the PMOS has to be turned off and NMOS turned on (NON state, as shown by the state 706). At this point if the Undervoltage input is still high we have to go back to turning on the PMOS, and turning off the NMOS as previously seen (illustrated by transition process 712). If on the other hand zero-cross input goes high instead (transition process 716), we have to turn off the NMOS and return to the OFF state where we started (state 708). It is important to note that if undervoltage and zero-cross are both 0 in NON, the circuit will wait till one of them goes high. In this manner, a complex interaction between the circuit and its external environment is broken down into a finite set of small interactions that can be composed to get very complex behaviour as represented by the specification 700.

It will be appreciated that "P" relates to "PMOS" and "N" relates to "NMOS". For simplicity, it can be stated that P=1 turns on the PMOS, N=1 turns on the NMOS, P=0 turns off the PMOS and N=0 turns off the NMOS.

It will be clear to the skilled person how the specification 700 may undergo the methods as described previously. For example, the specification 700 may be analysed to automatically determine the one or more tests, as described by step 204 of the method 200.

In the current example, the following information can be obtained about the behaviour of the buck converter controller from the specification 700 and this information can be used to derive the one or more tests.

1. The device under test will not respond with an action in the absence of an event
  a. P can never be 1 without the Undervoltage signal being asserted
2. Any number of events can be issued to the DUT simultaneously. There will be a response action from the device under test within a specified time of the event being issued if and only if the events issued match a permitted event sequence.
  a. The presence of a zero-cross should never initiate a transition from {P=1, N=0} b. This can be used to provide spurious inputs on the Zero-cross input to detect any faults in the design that may allow a change from {P=1, N=0}
3. The action sequence seen in such a case should be a member of a finite set of possible action sequences. This finite set depends on the event sequences issued previously and the state from which the arc starts. No other action sequences should be seen.
a. There can never be a case where N may toggle while P is 1
b. N may become 1 only if P was 1 earlier
c. This can be used to add checkers to the test bench to see that N does not unduly glitch or toggle when P is 1
d. This can also be used to identify that there should never be a state where both P and N are 1
e. More complex sequences of output changes can be used. In this case, the output ordering will also be checked.
4. The event corresponding to the action must have taken place in the immediate past of the action being seen. There should be no action sequence in between.
a. If P turns on, there should have been an Undervoltage condition in the immediate past when P was off
5. When transitioning from a state to another state (that may or may not be the same state), only actions defined as part of a single arc from the start to the end states should be observed.

A software program can use the above rules to automatically create a test bench that will provide events and check that the actions conform to the specification 700. Alternatively, or additionally, the program can statically analyse the design for conformance. The structure of the state machines can be analysed to infer the optimal choice of randomization ranges for the event generation in the test bench to obtain maximal coverage.

The software tool will take in the specification 700 and generate a simulation model which can be in any format acceptable by a simulator (for example: SystemVerilog, Verilog-A and Simplis model). The simulation model will behave exactly as described above by the specification 700.

Timing annotations can be added (e.g. once Overcurrent goes high, we have to turn off PMOS within a certain specified time.) The user can generate waveforms automatically using the tool if needed or other documentation, as discussed previously. This documentation may then be supplied to the circuit designer who will implement said circuit manually.

A verification engineer can use the compiler tool with the original specification 700 (in a text file format) to generate the test bench which will test this manually designed circuit.

How the circuit is verified has been explained previously. By way of example say we want to test the OFF state. We give random inputs at all irrelevant inputs (e.g overcurrent, zero cross) and observe no changes. Then we force undervoltage high and we see that PMOS (and PMOS only) goes high in a finite (possibly specified) time. Anything else if seen is an error. Now we move to PON and do another set of tests to test this state.

NON is more interesting as any of two possibilities can happen, either we can see an undervoltage and then turn off NMOS and turn on PMOS or we see a zero cross and then turn off the NMOS only. This means that if we give overcurrent, there should be no effect. We can try giving the other signal randomly either as only one transition or both of them. Depending on which is given we may see one of two responses only. Anything else indicates a faulty design.

Note that responses have to come within a finite time. Else it means the design is stuck which the test bench flags as a timeout.

Finally, the order of the signal toggles is important. For example, when the overcurrent happens, the PMOS should turn off first before the NMOS turns on. This can be understood with reference to the transition process 108 in FIG. 1B.

The behaviour of asynchronous circuits is not completely deterministic owing to metastability. The usage of arcs with actions however allows the identification of the exact arc traversed by the design. It is possible to algorithmically prove that the state machine information is enough to uniquely identify the arc traversal or to highlight cases where there is insufficient information. The use of multiple parallel arcs in a state machine in a specification is a unique part of the present disclosure and is important in dealing with metastable circuits.

Common reference numerals and variables between Figures denote common features.

Various improvements and modifications may be made to the above without departing from the scope of the disclosure.

What is claimed is:

1. A method for determining one or more tests suitable for verifying that a circuit conforms to a specification, wherein the specification comprises at least one state machine, the method comprising:
generating a simulation model using the specification;
simulating the simulation model;
updating the specification based on simulating the simulation model and prior to analysing the specification; and
analysing the specification to automatically determine the one or more tests.

2. The method of claim 1, wherein:
the, or each, state machine comprises a plurality of states; and
each state represents a state of the circuit.

3. The method of claim 2, wherein:
the plurality of states comprises a first state and a second state; and
the, or each, state machine comprises a transition process between the first state and the second state, the transition process representing a process under which the circuit transitions from the first state to the second state.

4. The method of claim 3, wherein:
the, or each, state machine comprises a non-transitioning process, the non-transitioning process representing a process under which the circuit remains in the first state.

5. The method of claim 3, wherein:
the transition process comprises at least one event and at least one action; and
the, or each, action is triggered by at least one associated event.

6. The method of claim 5, wherein the, or each, action triggers at least one event.

7. The method of claim 5, wherein:
the, or each, event represents a stimulus received by the circuit; and
the, or each, action represents a response of the circuit to the stimulus of the associated event.

8. The method of claim 7 wherein the stimulus represented by the, or each, event is at least one of:
a change in an input to the circuit;
a change to an internal signal in the circuit;
a change to an output of the circuit; and:
a change in a timer associated with the circuit.

9. The method of claim 7, wherein the response represented by the, or each, action is at least one of:
a change in an output of the circuit;
a change in a timer associated with the circuit; and
a change in an internal signal within the circuit.

10. The method of claim 5, wherein the, or at least one of the, actions corresponds to the circuit entering the second state.

11. The method of claim 10, wherein the, or the at least one of the, actions corresponding to the circuit entering second state is analysed to determine the one or more tests.

12. The method of claim 3, wherein:
the at least one state machine comprises a first state machine and a second state machine; and
the transition process from the first state to the second state of the first state machine is dependent on a state of the second state machine.

13. The method of claim 1 comprising generating a test bench for circuit verification using the specification.

14. The method of claim 1 comprising automatically synthesising the circuit from the specification.

15. The method of claim 1, wherein the circuit is an asynchronous circuit.

16. The method of claim 1, wherein the one or more tests are automatically determined using a compiler.

17. A method of verifying that a circuit conforms to a specification, wherein the specification comprises at least one state machine, the method comprising:
generating a simulation model using the specification;
simulating the simulation model;
updating the specification based on simulating the simulation model and prior to analysing the specification;
analysing the specification to automatically determine one or more tests suitable for verifying that the circuit conforms to the specification; and:
subjecting the circuit to the one or more tests to verify that the circuit conforms to the specification.

18. The method of claim 17, wherein the circuit is an asynchronous circuit.

19. A computer system comprising a module configured as a test determination tool for determining one or more tests suitable for verifying that a circuit conforms to a specification, wherein the specification comprises at least one state machine, the test determination tool being configured to
generate a simulation model using the specification;
simulate the simulation model;
update the specification based on simulating the simulation model and prior to analysing the specification; and
analyse the specification to automatically determine the one or more tests.

20. The computer system of claim 19, wherein the circuit is an asynchronous circuit.

21. A computer system comprising a module configured as a circuit verification tool for verifying that a circuit conforms to a specification, wherein the specification comprises at least one state machine, the circuit verification tool being configured to
generate a simulation model using the specification;
simulate the simulation model;
update the specification based on simulating the simulation model and prior to analysing the specification;
analyse the specification to automatically determine one or more tests suitable for verifying that the circuit conforms to the specification; and:
subject the circuit to the one or more tests to verify that the circuit conforms to the specification.

22. The computer system of claim 21, wherein the circuit is an asynchronous circuit.

23. A circuit having been verified that it conforms to a specification, wherein the specification comprises at least one state machine, using a method comprising:
generating a simulation model using the specification;
simulating the simulation model;
updating the specification based on simulating the simulation model and prior to analysing the specification;
analysing the specification to automatically determine one or more tests suitable for verifying that the circuit conforms to the specification; and:
subjecting the circuit to the one or more tests to verify that the circuit conforms to the specification.

24. The circuit of claim 23, wherein the circuit is an asynchronous circuit.

* * * * *